US011522549B2

(12) United States Patent
Oh

(10) Patent No.: US 11,522,549 B2
(45) Date of Patent: Dec. 6, 2022

(54) TIME-TO-DIGITAL CONVERTER AND SIGNAL ALIGNMENT METHOD USING THE SAME

(71) Applicant: HYUNDAI MOBIS CO., LTD., Seoul (KR)

(72) Inventor: Jung Dae Oh, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/545,269

(22) Filed: Dec. 8, 2021

(65) Prior Publication Data
US 2022/0190832 A1 Jun. 16, 2022

(30) Foreign Application Priority Data

Dec. 14, 2020 (KR) .................. 10-2020-0174132

(51) Int. Cl.
H03L 7/081 (2006.01)
H03L 7/18 (2006.01)
H03L 7/091 (2006.01)
(52) U.S. Cl.
CPC ............ H03L 7/0814 (2013.01); H03L 7/091 (2013.01); H03L 7/18 (2013.01)
(58) Field of Classification Search
CPC .......... H03L 7/0814; H03L 7/091; H03L 7/18
See application file for complete search history.

(56) References Cited

U.S. PATENT DOCUMENTS

| 10,826,502 | B1* | 11/2020 | Badizadegan | .......... H03L 7/085 |
| 11,201,624 | B2* | 12/2021 | Haneda | ................ H03M 1/201 |
| 11,381,246 | B2* | 7/2022 | Oh | ........ G04F 10/005 |
| 2019/0230304 | A1* | 7/2019 | Moore | .................... H03L 7/099 |
| 2020/0217959 | A1* | 7/2020 | Hall | ........................ G01S 17/10 |
| 2020/0284883 | A1* | 9/2020 | Ferreira | ................ G01S 7/4817 |
| 2020/0309917 | A1* | 10/2020 | Kudla | ..................... G01S 17/04 |
| 2021/0184684 | A1* | 6/2021 | Oh | ........................ G04F 10/005 |

(Continued)

FOREIGN PATENT DOCUMENTS

DE 102021101790 A1 * 7/2022
JP 2011023938 A * 2/2011

(Continued)

OTHER PUBLICATIONS

Li, Dong, et al., "An 8-ch LIDAR Receiver based on TDC with multi-interval detection and realtime in-situ calibration", IEEE Transactions on Instrumentation and Measurement 69.7 (2019): 5081-5090.

(Continued)

Primary Examiner — Adam D Houston
(74) Attorney, Agent, or Firm — NSIP Law

(57) ABSTRACT

A TDC (Time-To-Digital Converter) includes: a DLL (Delay Locked Loop) to delay a stop signal applied from an external element and to output a multi-phase signal; a synchronizer to synchronize the stop signal with a clock signal by using the multi-phase signal, and to output a synchronized stop signal; a counter to output a counter value by using the synchronized stop signal applied from the synchronizer; and a time information calculator to calculate time information of the stop signal based on the counter value and the multi-phase signal.

16 Claims, 11 Drawing Sheets

(56) References Cited

U.S. PATENT DOCUMENTS

| | | | | |
|---|---|---|---|---|
| 2022/0011434 A1* | 1/2022 | Rainko | .................. | G01S 7/483 |
| 2022/0083011 A1* | 3/2022 | Gu | ...................... | H03M 1/0602 |
| 2022/0158644 A1* | 5/2022 | Schat | ...................... | H03L 7/093 |
| 2022/0190832 A1* | 6/2022 | Oh | ........................ | H03L 7/0814 |

FOREIGN PATENT DOCUMENTS

| | | | |
|---|---|---|---|
| KR | 10-2087203 B1 | | 3/2020 |
| WO | WO-2021195831 A1 | * | 10/2021 |
| WO | WO-2022122928 A1 | * | 6/2022 |

OTHER PUBLICATIONS

Abdelmejeed, M., et al., "A Novel High Throughput High Resolution Two-Stage Oscillator-Based TDC", 2013 International SoC Design Conference (ISOCC). IEEE, 2013, (4 pages in English).
Korean Office Action dated Aug. 10, 2022, in counterpart Korean Patent Application No. 10-2020-0174132 (5 pages in Korean).

* cited by examiner

TIME-TO-DIGITAL CONVERTER AND SIGNAL ALIGNMENT METHOD USING THE SAME

CROSS-REFERENCE TO RELATED APPLICATION

This application claims priority from and the benefit of Korean Patent Application No. 10-2020-0174132, filed on Dec. 14, 2020, which is hereby incorporated by reference for all purposes as if set forth herein.

BACKGROUND

Field

Exemplary embodiments of the present disclosure relate to a TDC (Time-to-Digital Converter) and a signal alignment method using the same, and more particularly, to a TDC which checks the metastability state between a sampling clock and an asynchronous signal, which is generated from a LiDAR (Light Detection And Ranging) system when a signal generated from the LiDAR system is applied to a synchronizer through a DLL (Delay Locked Loop), and synchronizes the asynchronous signal, and a signal alignment method using the same.

Discussion of the Background

A LiDAR system is used to calculate the distance to an object. The LiDAR system recognizes the start and end of a light signal by converting the light signal into an electrical signal, and recognizes a distance by calculating a difference in time therebetween. The LiDAR system includes an optical unit configured to concentrate light and transmit/receive light, a sensor unit configured to convert the light signal into an electrical signal and transmit the electrical signal, a TDC configured to receive the electrical signal and convert time into a digital value, and an MCU (Micro Control Unit) configured to control the entire system.

The conventional LiDAR system samples an asynchronous signal by using the TDC or an ADC (Analog-to-Digital Converter). The ADC has a problem in that the ADC occupies a large area and has large power consumption, because it requires high-speed sampling. The TDC performs sampling according to a high-speed clock or multi-phase clocks by using a counter. In order to implement high resolution, the TDC performs sampling according to multi-phase clocks. In such a method, however, the number of multi-phases is limited, which makes it difficult to perform sampling for a long time. Furthermore, a method using both the counter and the multi-phase clocks may also be applied. However, an accurate synchronization method is not yet developed.

FIG. 1 illustrates a synchronization failure which occurs when a signal generated in a first clock domain is sampled too close to a rising edge of a clock signal in a second clock domain. As data changes before the data is latched in the second clock domain, the latch state of the data becomes ambiguous. That is, as a clock bclk on a receiving side between the two clock domains is metastable when the data is latched, incorrect data may be transferred to the following logics. A flip-flop has a specific set-up time and hold time. When these time windows change too close to another synchronization signal, a metastable output may be caused. Therefore, it is important to retain a data signal so as not to cause a metastable output.

SUMMARY OF THE INVENTION

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a TDC includes: a DLL (Delay Locked Loop) configured to delay a stop signal applied from an external element, and to output a multi-phase signal; a synchronizer configured to synchronize the stop signal with a clock signal by using the multi-phase signal, and to output a synchronized stop signal; a counter configured to output a counter value by using the synchronized stop signal applied from the synchronizer; and a time information calculator configured to calculate time information of the stop signal based on the counter value and the multi-phase signal.

The synchronizer may determine whether the stop signal is detected at a DLL<N> channel or a DLL<0> channel of the multi-phase signal outputted from the DLL. When the stop signal is detected at the DLL<N> channel or the DLL<0> channel, the synchronizer may determine that the stop signal is present around an edge of the clock signal, and realign a rising edge of the stop signal with a falling edge of the clock signal.

When the stop signal is detected at the DLL<N> channel, the synchronizer may determine that the stop signal is located before a boundary between counter values, and sample the stop signal with an inversion clock signal two times.

When the stop signal is detected at the DLL<0> channel, the synchronizer may determine that the stop signal is located after a boundary between counter values, and sample the stop signal with an inversion clock signal three times.

The synchronizer may determine whether the stop signal is detected at a DLL<N> channel or DLL<0> channel of the multi-phase signal outputted from the DLL. When the stop signal is not detected at either of the DLL<N> channel or the DLL<0> channel, the synchronizer may determine that the stop signal is not present around an edge of the clock signal, and sample the stop signal with an inversion clock signal three times.

The time information calculator may select a DLL channel having a highest correlation with time information of the stop signal, and add the DLL channel to the time information of the stop signal.

The synchronizer may determine whether the stop signal is asynchronous to the clock signal based on the multi-phase signal. The synchronizer may receive settings of DLL channels in a range corresponding to a metastability detection region, among DLL channels of the multi-phase signal outputted from the DLL, and determine whether the stop signal is asynchronous to the clock signal based on the multi-phase signal, when the stop signal is detected at the DLL channels in the received range.

The synchronizer may include: a first multiplexer configured to select an output signal to sample the stop signal with an inversion clock signal two or three times, when the stop signal is present in a DLL<N> channel or DLL<0> channel, and select an output signal to sample the stop signal with the inversion clock signal three times when the stop signal is not present in either of the DLL<N> channel and the DLL<0> channel; and a second multiplexer configured to transmit an output signal to the first multiplexer, select an output signal to sample the stop signal with an inversion clock signal three times, when the stop signal is present in the DLL<0> channel, and select an output signal to sample the stop signal with an inversion clock signal two times, when the stop signal is not present in the DLL<0> channel.

In another general aspect, a signal alignment method performed by a TDC includes: delaying a stop signal applied from an external element, and outputting a multi-phase signal; synchronizing the stop signal with a clock signal by using the multi-phase signal, and outputting a synchronized stop signal; outputting a counter value by using the synchronized stop signal; and calculating time information of the stop signal based on the counter value and the multi-phase signal.

The synchronizing of the stop signal with the clock signal may include: determining whether the stop signal is detected at a DLL<N> channel or a DLL<0> channel of the output multi-phase signal; determining that the stop signal is present around an edge of the clock signal, when the stop signal is detected at the DLL<N> channel or the DLL<0> channel; and realigning a rising edge of the stop signal with a falling edge of the clock signal.

The realigning of the rising edge of the stop signal with the falling edge of the clock signal may include determining that the stop signal is located before a boundary between counter values, when the stop signal is detected at the DLL<N> channel, and sampling the stop signal with an inversion clock signal two times.

The realigning of the rising edge of the stop signal with the falling edge of the clock signal may include determining that the stop signal is located after a boundary between counter values, when the stop signal is detected at the DLL<0> channel, and sampling the stop signal with an inversion clock signal three times.

The synchronizing of the stop signal with the clock signal may include: determining whether the stop signal is detected at a DLL<N> channel or a DLL<0> channel of the output multi-phase signal; determining that the stop signal is not present around an edge of the clock signal, when the stop signal is not detected at either of the DLL<N> channel or the DLL<0> channel; and sampling the stop signal with an inversion clock signal three times.

The calculating of the time information of the stop signal may include selecting a DLL channel having a highest correlation with the time information of the stop signal, and adding the DLL channel to the time information of the stop signal.

The signal alignment method may further include determining whether the stop signal is asynchronous to the clock signal based on the multi-phase signal. The determining of whether the stop signal is asynchronous to the clock signal may include: receiving settings of DLL channels in a range corresponding to a metastability detection region among DLL channels of the output multi-phase signal; and determining whether the stop signal is asynchronous to the clock signal based on the multi-phase signal, when the stop signal is detected at the DLL channels in the received range.

In another general aspect, a LiDAR signal processing device includes: a sensor unit configured to generate a stop signal by amplifying an electrical signal generated through light reflected from a target object; a time-to-digital converter configured to synchronize the stop signal; and an MCU (Micro Control Unit) configured to control a system, and calculate distance information by using the stop signal. The TDC includes: a DLL configured to delay the stop signal applied from an external element, and to output a multi-phase signal; a synchronizer configured to synchronize the stop signal with a clock signal by using the multi-phase signal, and to output a synchronized stop signal; a counter configured to output a counter value by using the synchronized stop signal applied from the synchronizer; and a time information calculator configured to calculate time information of the stop signal based on the counter value and the multi-phase signal.

Other features and aspects will be apparent from the following detailed description, the drawings, and the claims.

DETAILED DESCRIPTION OF THE ILLUSTRATED EMBODIMENTS

Figure 1:
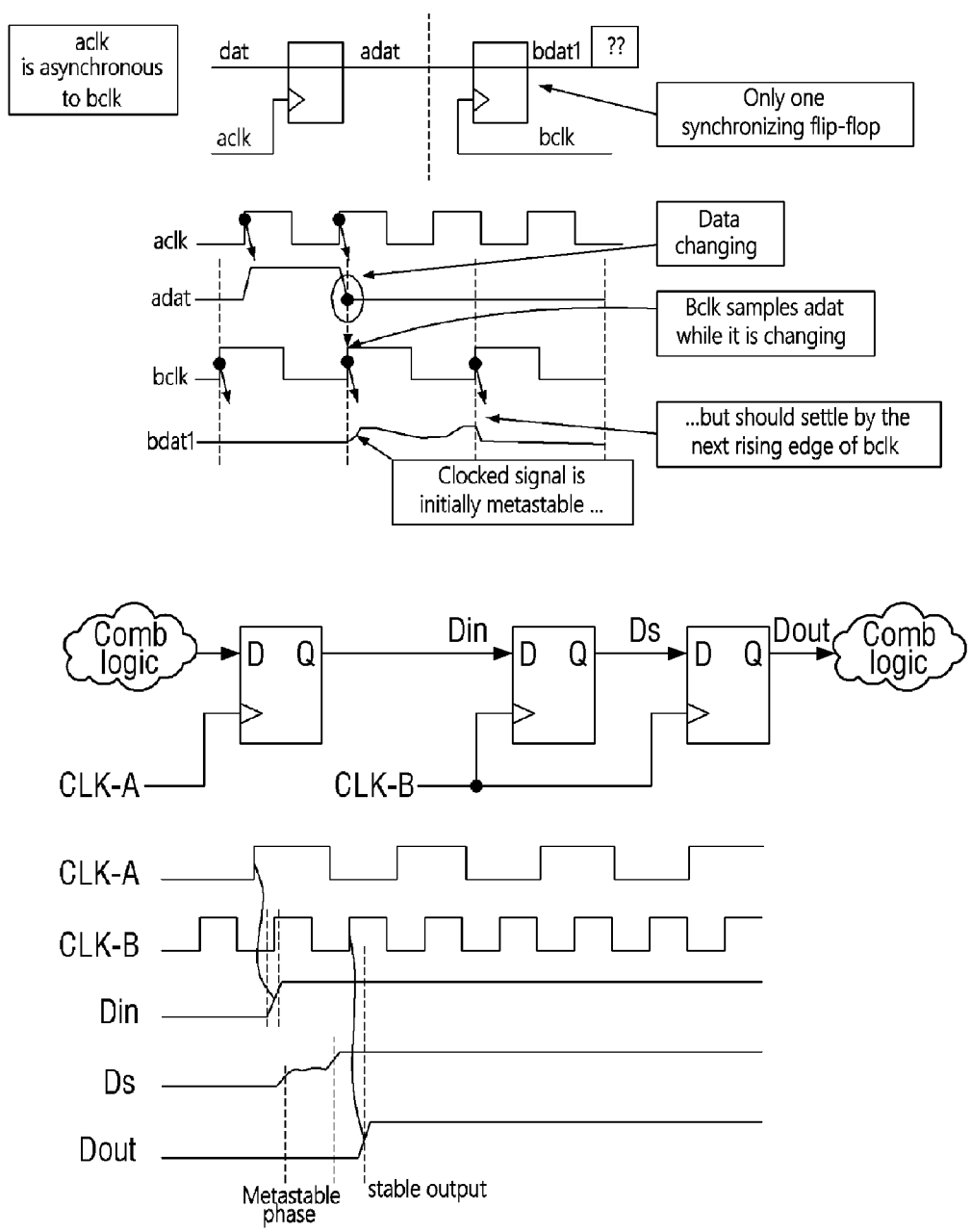
FIG. 1 is a diagram for describing a problem which occurs in a conventional LiDAR system while clocks are asynchronous to each other.

Hereafter, various embodiments will be described in detail with reference to the accompanying drawings. The advantages and characteristics of the present disclosure and a method for achieving the advantages and characteristics will be clearly understood with reference to the following embodiments along with the accompanying drawings. However, the present disclosure may be embodied in various forms and should not be construed as limited to the embodiments set forth herein. These embodiments are provided so as to make this disclosure thorough and complete, and to fully convey the scope of the present disclosure to those skilled in the art to which the present disclosure pertains. The present disclosure is only defined by the scope of claims. Through the specification, like reference numerals represent the same components.

Unless otherwise defined, all terms (including technical and scientific terms) used in this specification may be used as meanings which can be commonly understood by those skilled in the art to which the present disclosure pertains. Furthermore, the terms which are defined in a generally used dictionary are not ideally or excessively construed unless clearly and specifically defined. The terms used in this specification are only used to describe embodiments, and do not limit the present disclosure. In this specification, the terms of a singular form may include plural forms unless referred to the contrary.

Hereafter, some embodiments will be described with reference to the accompanying drawings.

Figure 2:
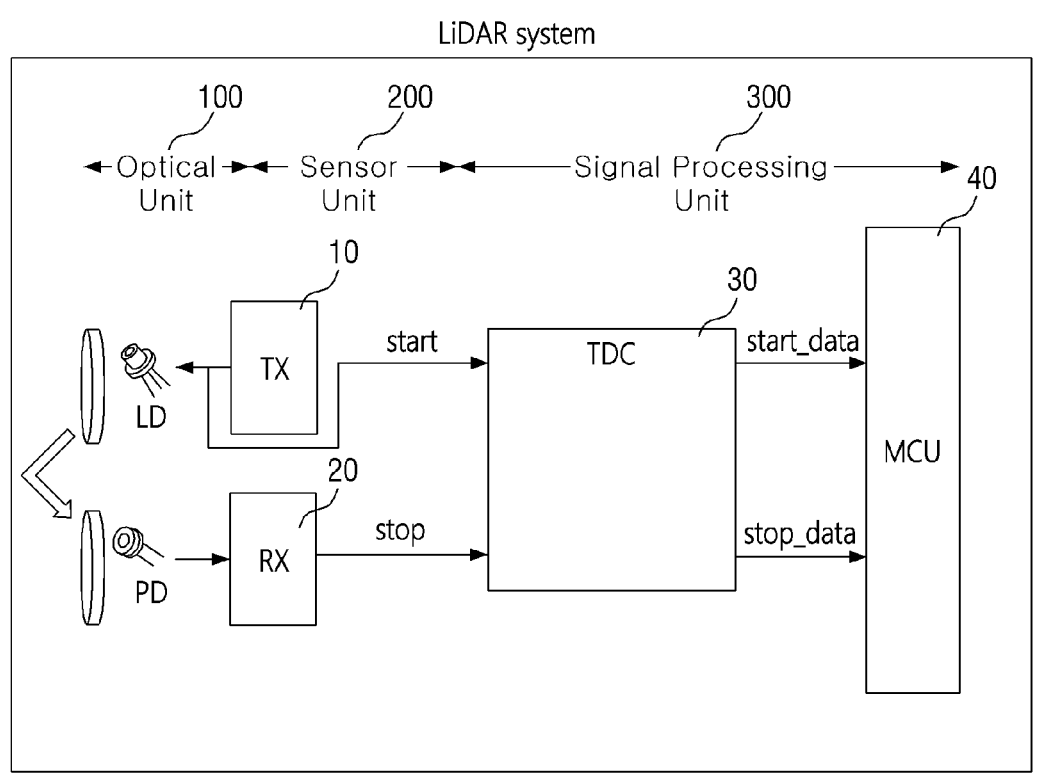
FIG. 2 is a diagram illustrating a LiDAR system in accordance with an embodiment of the present disclosure.

FIG. 2 is a diagram illustrating a LiDAR system in accordance with an embodiment of the present disclosure.

Referring to FIG. 2, the LiDAR system in accordance with the present embodiment may include an optical unit 100, a sensor unit 200 and a signal processing unit 300.

The optical unit 100 may include a laser diode LD configured to transmit light in response to a control signal received from a transceiver and a photo detector PD configured to receive reflected light and convert the received light into an electrical signal.

The sensor unit 200 may include a transceiver (TX) 10 configured to generate a pulse signal under control of an MCU (Micro Control Unit) and a receiver (RX) 20 configured to amplifier a small electrical signal such that the signal can be processed.

The signal processing unit 300 may include a TDC 30 and an MCU (Micro Control Unit) 40.

The TDC 30 may serve to convert time information of start and stop signals into digital information. The MCU 40 may serve to calculate distance information while controlling the system.

When the optical unit 100 transmits light toward a target object, the LiDAR system may apply a start signal generated through the optical unit 100 to the TDC 30. When the optical unit 100 receives light, the LiDAR system may apply a stop signal generated through the optical unit 100 to the TDC 30. The LiDAR system may measure the distance to the target object by using information of data start_data and stop_data applied to the MCU 40.

In this specification, the case in which the TDC 30 is applied to a LiDAR system is taken as an example for description. However, the present disclosure is not limited thereto, and the TDC 30 may be applied to various applications in which a synchronized signal needs to be processed.

In the LiDAR system in accordance with the present embodiment, the TDC 30 may check the metastability state between an asynchronous signal and a sampling clock, and synchronize the asynchronous signal. This operation will be described in more detail with reference to FIGS. 3 to 6.

Figure 3:
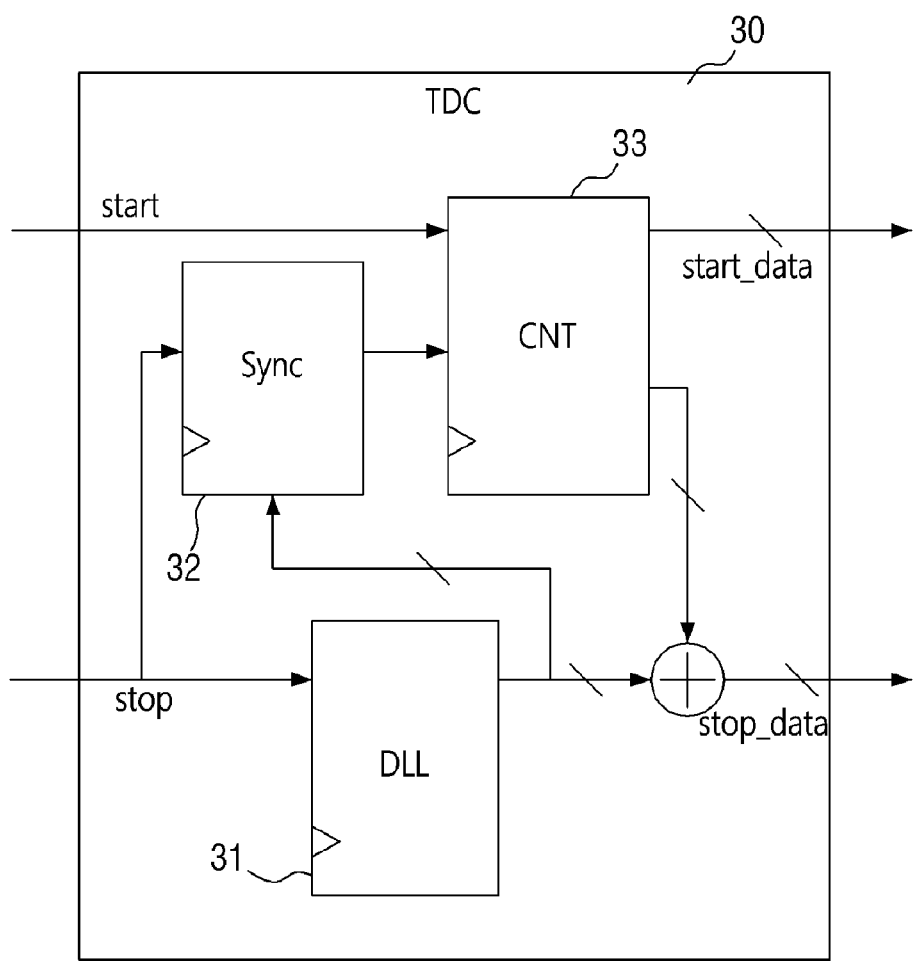
FIG. 3 is a diagram schematically illustrating a configuration of a TDC (Time-to-Digital Converter) in accordance with the embodiment of the present disclosure.
Figure 4:
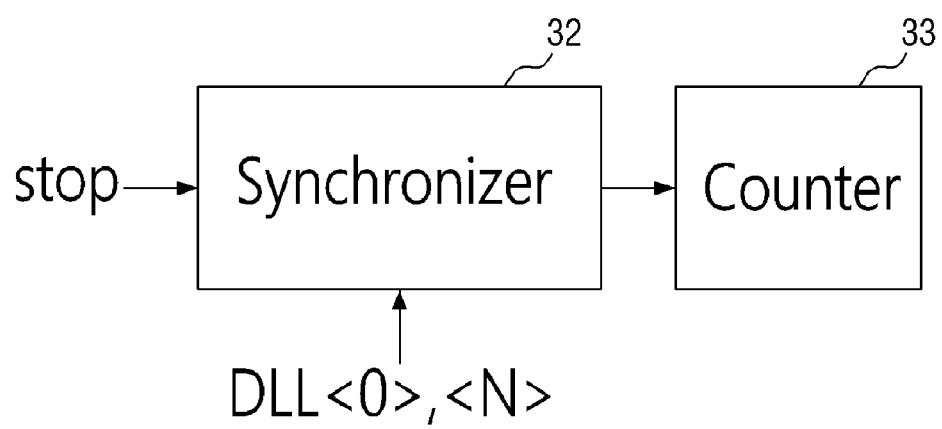
FIG. 4 is a diagram for describing a signal inputted to a synchronizer and a signal outputted to a counter from the synchronizer.
Figure 5:
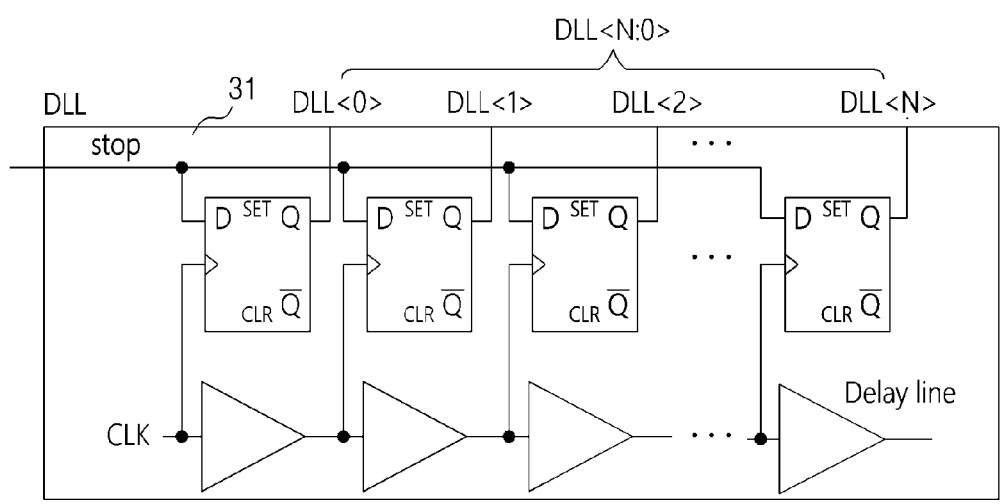
FIG. 5 is a diagram for describing a configuration of a DLL (Delay Locked Loop) which delays a stop signal applied from an external element and outputs a multi-phase signal.

FIG. 3 is a diagram illustrating a configuration of the TDC 30 in accordance with an embodiment of the present disclosure, FIG. 4 is a diagram for describing a signal inputted to a synchronizer 32 and a signal outputted to a counter 33 from the synchronizer 32, and FIG. 5 is a diagram for describing a configuration of a DLL (Delay Locked Loop) 31 which delays a stop signal applied from an external element and outputs a multi-phase signal.

Referring to FIG. 3, the TDC 30 may include the DLL 31, the synchronizer 32, the counter 33 and a timing information calculator.

The DLL 31 may delay a stop signal applied from an external element, and output a multi-phase signal. The synchronizer 32 may synchronize the stop signal with a clock signal on the basis of the multi-phase signal, and output the synchronized signal. In this specification, it is described that the stop signal is information generated by light received through the optical unit of the LiDAR system. However, the present disclosure is not limited to the name of the stop signal or the above-described condition, but the stop signal may indicate various pieces of information which can be applied to the TDC 30 to perform synchronization.

The counter 33 may output a counter value by using the synchronized stop signal applied from the synchronizer 32. The time information calculator may calculate the time information of the stop signal on the basis of the output counter value and the multi-phase signal.

As illustrated in FIG. 4, the synchronizer 32 may receive the multi-phase signal from the DLL 31 and receive the stop signal from the optical unit. The synchronizer 32 may synchronize the stop signal with the clock signal by using the multi-phase signal, and output the synchronized stop signal. The stop signal outputted from the synchronizer 32 may be applied to the counter 33.

The multi-phase signal applied to the synchronizer 32 may be a DLL<0> channel and a DLL<N> channel, which are generated by the DLL 31, as illustrated in FIG. 5. As illustrated in FIG. 5, the DLL 31 may generate a delayed stop signal by using the stop signal, and generate DLL<0> to DLL<N> channels according to the preset number of N's.

The synchronizer 32 may determine whether the stop signal is asynchronous to the clock signal, by using the multi-phase signal. Specifically, the synchronizer 32 may receive the settings of DLL channels in a range corresponding to a metastability detection region, among the DLL channels of the multi-phase signal, outputted from the DLL 31. When the stop signal is detected at the DLL channels in the received range, the synchronizer 32 may determine whether the stop signal is asynchronous to the clock signal, on the basis of the multi-phase signal.

That is, the synchronizer 32 may receive the DLL channels in the range set to the metastability detection region, as the DLL<N> and DLL<0> or DLL<N-1>, DLL<N>, DLL<0> and DLL<1>. The synchronizer 32 may adjust the range of the metastability detection region according to the various ranges inputted through the above-described method.

In order to describe the operation of the synchronizer 32 of FIG. 4 in more detail, the configuration of the synchronizer 32 will be described with reference to FIG. 6.

Figure 6:
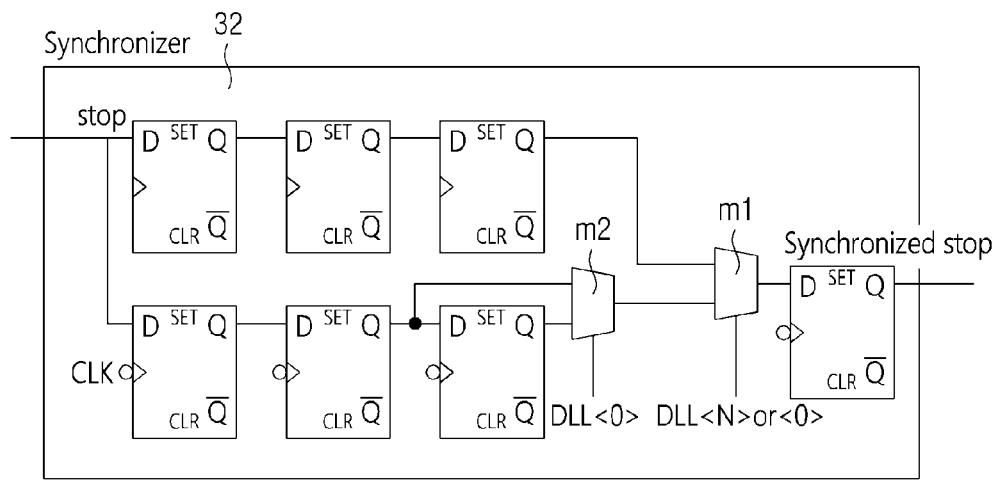
FIG. 6 is a diagram for describing a configuration of a synchronizer which synchronizes a stop signal with a clock signal through a multiplexer, and outputs the synchronized stop signal.

As illustrated in FIG. 6, the synchronizer 32 may perform sampling by using a plurality of flip-flops and multiplexers. The synchronizer 32 may output a signal selected through a first multiplexer m1 and a second multiplexer m2.

When the stop signal is present in the DLL<N> channel or DLL<0> channel, the first multiplexer m1 may select an output signal to sample the stop signal with an inversion clock signal two or three times. At this time, when the stop signal is not present in the DLL<N> channel and the DLL<0> channel, the first multiplexer m1 may select an output signal to sample the stop signal with the inversion clock signal three times.

The second multiplexer m2 may transmit an output signal to the first multiplexer m1. When the stop signal is present in the DLL<0> channel, the second multiplexer m2 may select an output signal to sample the stop signal with the inversion clock signal three times. Furthermore, when the stop signal is not present in the DLL<0> channel, the second multiplexer m2 may select an output signal to sample the stop signal with the inversion clock signal two times.

In FIG. 6, the number of the flip-flops included in the synchronizer 32 is only an example, and it has been described that sampling is performed two or three times. However, the present disclosure is not limited thereto. For example, the output signal applied to the first and second multiplexers m1 and m2 may be an output signal sampled once or twice, an output signal sampled three or four times, or an output signal sampled two or four times in some cases. That is, depending on an implementation method or environment, an output signal may be sampled various numbers of times.

That is, the flip-flops of FIG. 6 are illustrated to describe the configuration for performing sampling, and the present disclosure is not limited to the number of the flip-flops illustrated in FIG. 6.

Hereafter, various embodiments of the sampling performed by the synchronizer 32 will be described with reference to FIGS. 7 to 9.

Figure 7:
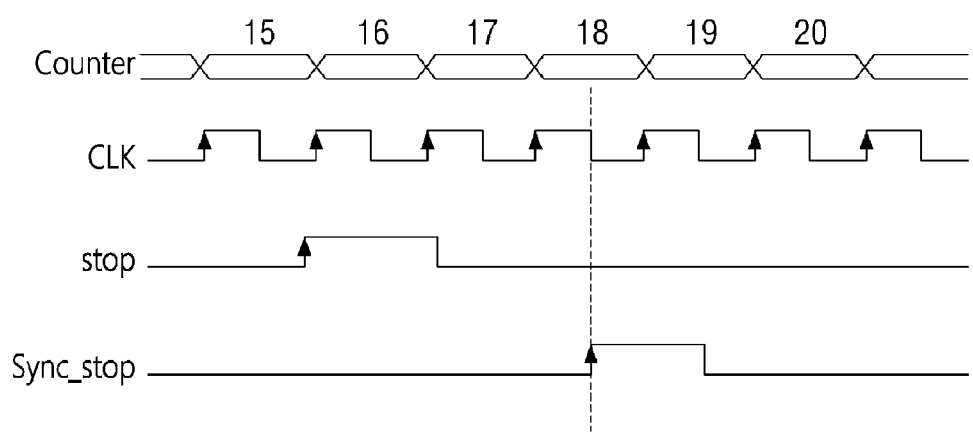
FIG. 7 is a diagram illustrating an example in which the synchronizer samples the stop signal and outputs the synchronized stop signal.

When the stop signal is detected at the DLL<N> channel as illustrated in FIG. 7, the synchronizer 32 may determine that the stop signal is located before the boundary between count values, and sample the stop signal with the inversion clock signal two times.

When the stop signal is detected at the DLL<N> channel, the synchronizer 32 may determine that the stop signal is located before the boundary between the counter values. Specifically, the values of the DLL<0> and DLL<N> channels may indicate the start and end of a counter clock signal. Therefore, when the stop signal is detected at the DLL<0> or DLL<N> channel, it indicates that the stop signal is present around an edge of a counter value. Therefore, the synchronizer 32 determines whether the stop signal is a value before or after the boundary between counter values, according to the data of the DLL<0> or DLL<N> channel. When the stop signal is detected at the DLL<N> channel, the synchronizer 32 determines that the stop signal is located before the boundary between the counter values, and samples the stop signal with the inversion clock signal two times, thereby realigning the stop signal with a falling edge of the clock signal. Therefore, when a rising edge of the stop signal is located immediately before the boundary between 15 and 16 in the counter 33, the synchronizer 32 may locate the stop signal at a falling edge of the clock signal at 18 of the counter 33.

At this time, in FIG. 6, the first multiplexer m1 may select a signal outputted from the second multiplexer m2. The second multiplexer m2 may select the output signal, which has been sampled twice, according to the DLL<N> channel.

Figure 8:
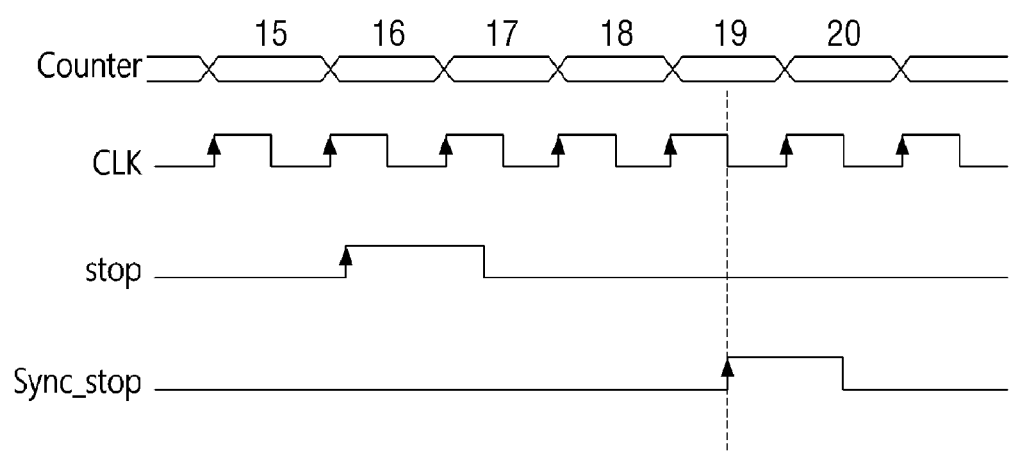
FIG. 8 is a diagram illustrating another example in which the synchronizer samples the stop signal and outputs the synchronized stop signal.

When the stop signal is detected at the DLL<0> channel as illustrated in FIG. 8, the synchronizer 32 may determine that the stop signal is located after the boundary between the counter values, and sample the stop signal with the inversion clock signal three times. At this time, in FIG. 6, the first multiplexer m1 may select a signal outputted from the second multiplexer m2. The second multiplexer m2 may select the output signal, which has been sampled three times, according to the DLL<0> channel. Therefore, when a rising edge of the stop signal is located immediately after the boundary between 15 and 16 in the counter 33, the synchronizer 32 may locate the stop signal at a falling edge of the clock signal at 19 of the counter 33.

When the stop signal is detected at the DLL<0> channel, the synchronizer 32 determines that the stop signal is located before the boundary between counter values, and samples the stop signal with the inversion clock signal three times, thereby realigning the stop signal with a falling edge of the clock signal.

Figure 9:
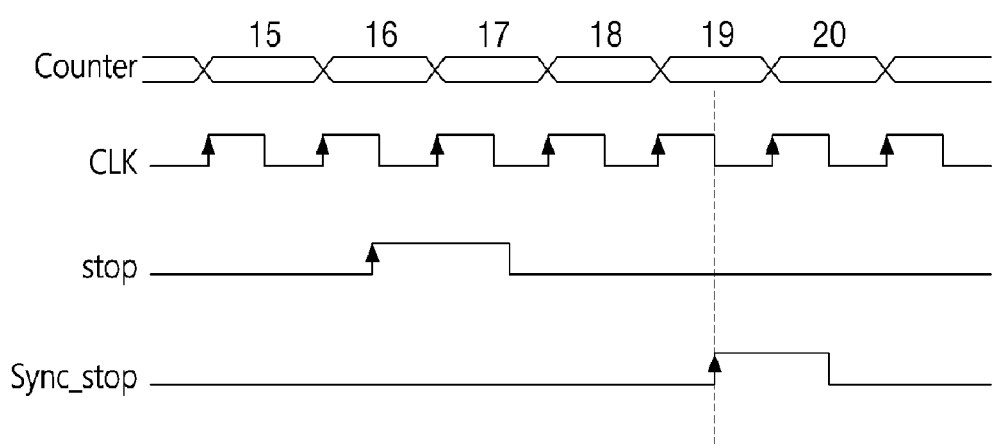
FIG. 9 is a diagram illustrating still another example in which the synchronizer samples the stop signal and outputs the synchronized stop signal.

Furthermore, when the stop signal is not detected at either of the DLL<N> channel and the DLL<0> channel as illustrated in FIG. 9, the synchronizer 32 may determine that the stop signal is not present around an edge of the clock signal. Therefore, when a rising edge of the stop signal is located at a position which is sufficiently away from the boundary between 15 and 16 in the counter 33, the synchronizer 32 may locate the stop signal at a falling edge of the clock signal at 19 of the counter 33.

At this time, since the stop signal was not detected at either of the DLL<N> channel and the DLL<0> channel, the first multiplexer m1 of FIG. 6 selects an output signal obtained by sampling the stop signal with the inversion signal three times.

In an embodiment, the time information calculator may select a DLL channel having the highest correlation with time information of the stop signal, among the DLL channels, and add the selected DLL channel to the time information of the stop signal.

The TDC 30 in accordance with the present disclosure may raise the time division resolution by synchronizing an asynchronous signal by using multi-phases, such that the lidar system can sense a target object at a long distance with high resolution.

So far, the TDC 30 in accordance with the embodiment of the present disclosure has been described with reference to FIGS. 2 to 9. Hereafter, a signal alignment method using the TDC 30 will be described with reference to FIGS. 10 and 11. The method in accordance with the present embodiment may be performed by a computing device. For example, the computing device may be a signal alignment device. When the present embodiment is described, an expression for a subject that performs some operations may be omitted. At this time, the subject is the computing device. Furthermore, the descriptions of the same operation as the operation described in the above embodiment will be omitted herein.

Figure 10:
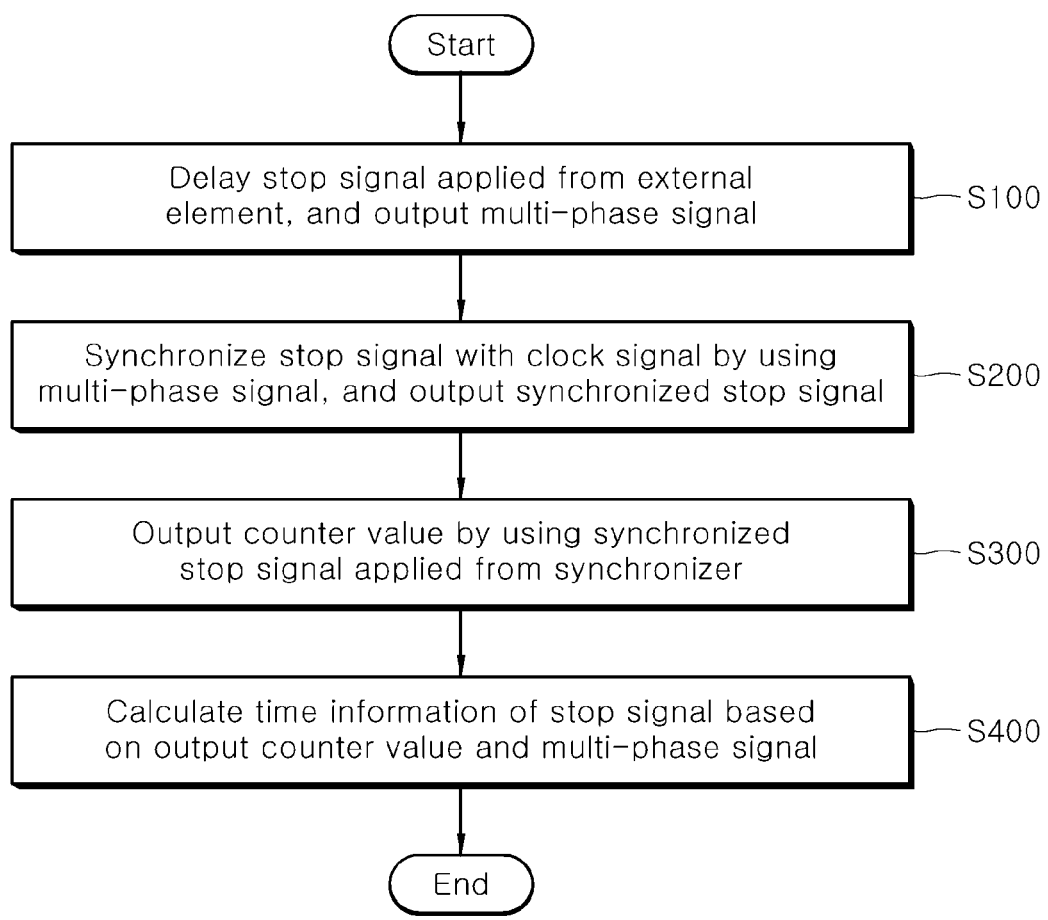
FIG. 10 is a flowchart illustrating a signal alignment method in accordance with another embodiment of the present disclosure.
Figure 11:
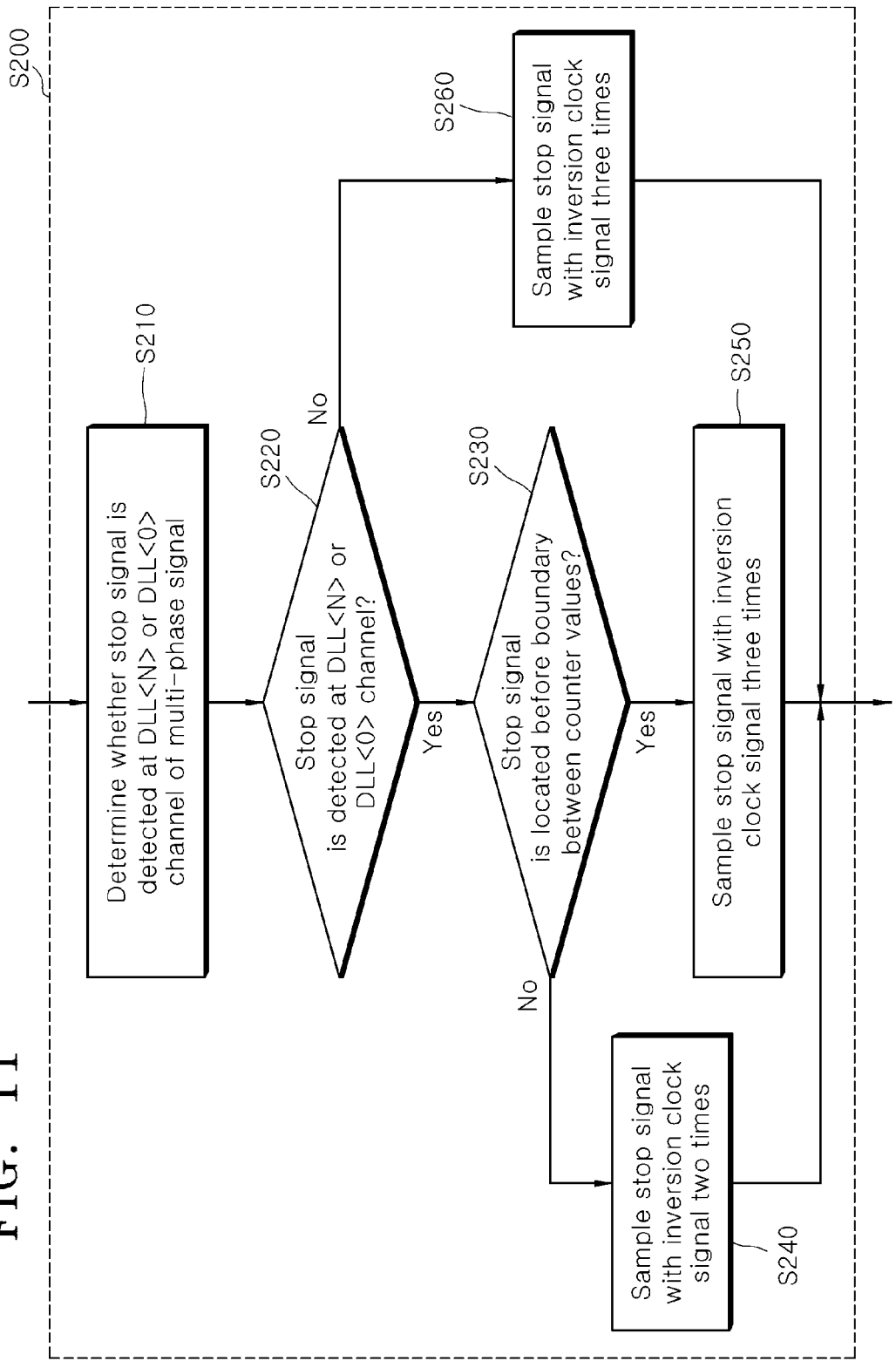
FIG. 11 is a flowchart for describing step S200 of FIG. 10 in detail.

FIG. 10 is a flowchart illustrating a signal alignment method in accordance with another embodiment of the present disclosure, and FIG. 11 is a flowchart for describing step S200 of FIG. 10 in detail.

As illustrated in FIG. 10, the computing device may delay a stop signal applied from an external element and output a multi-phase signal in step S100, and synchronize the stop signal with a clock signal by using the multi-phase signal in step S200. Then, the computing device may output a counter value by using the synchronized stop signal applied from the synchronizer 32 in step S300, and calculate the time information of the stop signal on the basis of the output counter value and the multi-phase signal, in step S400.

At this time, the computing device performs an operation of checking the metastability state between an asynchronous signal and a sampling clock, and synchronizing the asynchronous signal. This operation will be described in more detail with reference to FIG. 11.

When the stop signal is synchronized with the clock signal through the multi-phase signal in step S200, the computing device may determine whether the stop signal is detected at the DLL<N> channel or the DLL<0> channel of the multi-phase signal outputted from the DLL 31, in step S210.

Specifically, the computing device may determine whether the stop signal is asynchronous to the clock signal, on the basis of the multi-phase signal. When the settings of DLL channels in a range corresponding to a metastability detection region among the DLL channels of the multiphase signal outputted from the DLL 31 are received and the stop signal is detected at the DLL channels in the received range, the computing device may determine whether the stop signal is asynchronous to the clock signal, on the basis of the multi-phase signal.

Then, when the stop signal is detected at the DLL<N> channel or the DLL<0> channel in step S220, the computing device may determine that the stop signal is present around an edge of the clock signal. In this case, step S230 may be performed. When the stop signal is detected at the DLL<N> channel, the computing device may determine that the stop signal is located before the boundary between counter values, and perform step S250 to sample the stop signal with the inversion clock signal twice.

When the stop signal is detected at the DLL<0> channel, the computing device may determine that the stop signal is located after the boundary between the counter values, and perform step S240 to sample the stop signal with the inversion clock signal three times.

When the stop signal is not detected at either of the DLL<N> channel and the DLL<0> channel in step S220, the computing device may determine that the stop signal is not present around the edge of the clock signal, and perform step S260 to sample the stop signal with the inversion clock signal three times. When step S260 is performed, the computing device may select a DLL channel having the highest correlation with the time information of the stop signal, and add the DLL channel to the time information of the stop signal.

In the present embodiment, it has been described that the sampling is performed two or three times. However, the present disclosure is not limited thereto. For example, the stop signal may be sampled once or twice, three or four times, or two or four times in some cases in step S240, S250 or S260. The number of samplings may be changed to various numbers of times depending on an implementation method or environment.

That is, the numbers of samplings are only examples for describing that sampling is performed in different manners depending on the position at which a rising edge of the stop signal is detected at the boundary between counter values, and the present disclosure is not limited to the sampling counts illustrated in the drawing.

So far, the signal alignment method disclosed in this specification has been described with reference to FIGS. 10 and 11.

The methods in accordance with the above-described embodiments may be performed by executing a computer program implemented as computer readable codes. The computer program may be transmitted from a first computing device to a second computing device through a network such as the Internet, installed in the second computing device, and thus used by the second computing device. Examples of the first and second computing devices include a server device, a physical server belonging to a server pool for a cloud service, and a fixed computing device such as a desktop PC.

The computer program may be stored in a recording medium such as DVD-ROM or flash memory device.

Although exemplary embodiments of the disclosure have been disclosed for illustrative purposes, those skilled in the art will appreciate that various modifications, additions and substitutions are possible, without departing from the scope and spirit of the disclosure as defined in the accompanying claims. Thus, the true technical scope of the disclosure should be defined by the following claims.

What is claimed is:

1. A time-to-digital converter comprising:
   a DLL (Delay Locked Loop) configured to delay a stop signal applied from an external element, and to output a multi-phase signal;
   a synchronizer configured to synchronize the stop signal with a clock signal by using the multi-phase signal, and to output a synchronized stop signal;
   a counter configured to output a counter value by using the synchronized stop signal applied from the synchronizer; and
   a time information calculator configured to calculate time information of the stop signal based on the counter value and the multi-phase signal.

2. The time-to-digital converter of claim 1, wherein the synchronizer is configured to determine whether the stop signal is detected at a DLL<N> channel or a DLL<0> channel of the multi-phase signal outputted from the DLL, wherein when the stop signal is detected at the DLL<N> channel or the DLL<0> channel, the synchronizer is configured to determine that the stop signal is present around an edge of the clock signal, and to realign a rising edge of the stop signal with a falling edge of the clock signal.

3. The time-to-digital converter of claim 2, wherein when the stop signal is detected at the DLL<N> channel, the synchronizer is configured to determine that the stop signal is located before a boundary between counter values, and to sample the stop signal with an inversion clock signal two times.

4. The time-to-digital converter of claim 2, wherein when the stop signal is detected at the DLL<0> channel, the synchronizer is configured to determine that the stop signal is located after a boundary between counter values, and to sample the stop signal with an inversion clock signal three times.

5. The time-to-digital converter of claim 1, wherein the synchronizer is configured to determine whether the stop signal is detected at a DLL<N> channel or DLL<0> channel of the multi-phase signal outputted from the DLL, wherein when the stop signal is not detected at either of the DLL<N> channel or the DLL<0> channel, the synchronizer is configured to determine that the stop signal is not present around an edge of the clock signal, and to sample the stop signal with an inversion clock signal three times.

6. The time-to-digital converter of claim 5, wherein the time information calculator is configured to select a DLL channel having a highest correlation with time information of the stop signal, and to add the DLL channel to the time information of the stop signal.

7. The time-to-digital converter of claim 1, wherein the synchronizer is configured to determine whether the stop signal is asynchronous to the clock signal based on the multi-phase signal,
   wherein the synchronizer is configured to receive settings of DLL channels in a range corresponding to a meta-stability detection region, among DLL channels of the multi-phase signal outputted from the DLL, and to determine whether the stop signal is asynchronous to the clock signal based on the multi-phase signal when the stop signal is detected at the DLL channels in the received range.

8. The time-to-digital converter of claim 1, wherein the synchronizer comprises:
   a first multiplexer configured to select an output signal to sample the stop signal with an inversion clock signal two or three times, when the stop signal is present in a DLL<N> channel or DLL<0> channel, and to select an output signal to sample the stop signal with the inversion clock signal three times when the stop signal is not present in either of the DLL<N> channel or the DLL<0> channel; and
   a second multiplexer configured to transmit an output signal to the first multiplexer, select an output signal to sample the stop signal with an inversion clock signal three times, when the stop signal is present in the DLL<0> channel, and to select an output signal to sample the stop signal with an inversion clock signal two times, when the stop signal is not present in the DLL<0> channel.

9. A signal alignment method performed by a time-to-digital converter, comprising:
   delaying a stop signal applied from an external element, and outputting a multi-phase signal;
   synchronizing the stop signal with a clock signal by using the multi-phase signal, and outputting a synchronized stop signal;
   outputting a counter value by using the synchronized stop signal; and
   calculating time information of the stop signal based on the counter value and the multi-phase signal.

10. The signal alignment method of claim 9, wherein synchronizing the stop signal with the clock signal comprises:
   determining whether the stop signal is detected at a DLL<N> channel or a DLL<0> channel of the output multi-phase signal;
   determining that the stop signal is present around an edge of the clock signal, when the stop signal is detected at the DLL<N> channel or the DLL<0> channel; and
   realigning a rising edge of the stop signal with a falling edge of the clock signal.

11. The signal alignment method of claim 10, wherein realigning the rising edge of the stop signal with the falling edge of the clock signal comprises determining that the stop signal is located before a boundary between counter values, when the stop signal is detected at the DLL<N> channel, and sampling the stop signal with an inversion clock signal two times.

12. The signal alignment method of claim 10, wherein realigning the rising edge of the stop signal with the falling edge of the clock signal comprises determining that the stop signal is located after a boundary between counter values, when the stop signal is detected at the DLL<0> channel, and sampling the stop signal with an inversion clock signal three times.

13. The signal alignment method of claim 9, wherein synchronizing the stop signal with the clock signal comprises:
   determining whether the stop signal is detected at a DLL<N> channel or a DLL<0> channel of the output multi-phase signal;
   determining that the stop signal is not present around an edge of the clock signal, when the stop signal is not detected at either of the DLL<N> channel or the DLL<0> channel; and
   sampling the stop signal with an inversion clock signal three times.

14. The signal alignment method of claim 13, wherein calculating the time information of the stop signal comprises selecting a DLL channel having a highest correlation with the time information of the stop signal, and adding the DLL channel to the time information of the stop signal.

15. The signal alignment method of claim 9, further comprising determining whether the stop signal is asynchronous to the clock signal based on the multi-phase signal,
   wherein determining whether the stop signal is asynchronous to the clock signal comprises:
   receiving settings of DLL channels in a range corresponding to a metastability detection region among DLL channels of the output multi-phase signal; and
   determining whether the stop signal is asynchronous to the clock signal based on the multi-phase signal, when the stop signal is detected at the DLL channels in the received range.

16. A LiDAR signal processing device comprising:
   a sensor unit configured to generate a stop signal by amplifying an electrical signal generated through light reflected from a target object;
   a time-to-digital converter configured to synchronize the stop signal; and
   an MCU (Micro Control Unit) configured to control a system, and to calculate distance information by using the stop signal,
   wherein the time-to-digital converter comprises:
   a DLL (Delay Locked Loop) configured to delay the stop signal applied from an external element, and to output a multi-phase signal;
   a synchronizer configured to synchronize the stop signal with a clock signal by using the multi-phase signal, and to output a synchronized stop signal;
   a counter configured to output a counter value by using the synchronized stop signal applied from the synchronizer; and
   a time information calculator configured to calculate time information of the stop signal based on the counter value and the multi-phase signal.

* * * * *